United States Patent [19]

Cappelli

[11] Patent Number: 5,417,953
[45] Date of Patent: May 23, 1995

[54] APPARATUS AND METHOD FOR SYNTHESIZING DIAMOND IN SUPERCRITICAL WATER

[75] Inventor: Mark A. Cappelli, Santa Clara County, Calif.

[73] Assignee: The Board of Trustees of the Leland Stanford Junior University, Stanford, Calif.

[21] Appl. No.: 232,571

[22] Filed: Apr. 21, 1994

Related U.S. Application Data

[63] Continuation of Ser. No. 979,667, Nov. 20, 1992, abandoned.

[51] Int. Cl.⁶ .............................................. C01B 31/06
[52] U.S. Cl. .................................................... 423/446
[58] Field of Search ........................................ 423/446

[56] References Cited

U.S. PATENT DOCUMENTS 4,543,190  9/1985  Modell .............................. 210/761

OTHER PUBLICATIONS

"Solubility of Hydrocarbons in Water Near the Critical Solution Temperatures"; J. F. Connolly; Journal of Chemical & Engineering Data; vol. 11, No. 1, Jan. 1966.
"Heterolysis and Homolysis in Supercritical Water"; M. J. Antal, Jr. et al.; Super Critical Fluids; 1987 American Chemical Society; Chapter 7, pp. 77–86. (no month).
"Fundamental Kinetics of Methanol Oxidation in Supercritical Water"; P. A. Webley et al.; Supercritical Fluid Science and Technology; 1989 American Chemical Society; Chapter 17, pp. 259–275. (no month).
"An investigation of diamond film deposition in a premixed oxyacetylene flame" M. A. Cappelli et al.; J. Appl. Phys. 67(5), 1 Mar. 1990; pp. 2596–2602.
"An Investigation of Diamond Synthesis in an Oxygen-Acetylene Diffusion Flame"; M. A. Cappelli; New Diamond Science & Tech, 1991 MRS Int. Conf. Proc. pp. 511–516. (no month).
"Fundamental Kinetics of Methane Oxidation in Supercritical Water"; P. A. Webley et al.; Energy & Fuels, vol. 5, No. 3; Aug. 22, 1990.
"Supercritical Water–A Medium For Chemistry"; R. W. Shaw et al.; Chemical & Engineering News; Dec. 23, 1991; pp. 26–39.
"Methane and Methanol Diffusion Flames in Supercritical Water"; R. R. Steeper et al.; Sandia Report; SAND92-8474, Jun. 1992.
"Thin Film Diamond Growth Mechanisms"; J. E. Butler et al.; 1993 The Royal Society; Trans. R. Soc. London, A(1993) 342; pp. 209–211 (no month).
"Water and Aqueous Solutions at High Pressures and Temperatures"; E. U. Franck; O. Wichterle; pp. 13–29. (no date).
Boikess et al. *Chemical Principles* 1978 (no month) Harper & Row, NY. N.Y. portion of chapter 8.

*Primary Examiner*—Gary P. Straub
*Assistant Examiner*—Stuart L. Hendrickson
*Attorney, Agent, or Firm*—Flehr, Hohbach, Test, Albritton & Herbert

[57]  ABSTRACT

A process and apparatus for the synthesis of diamond from carbon precursors in supercritical water is described. The method involves the oxidation and/or pyrolysis of gaseous, liquid or solid phase carbon precursors in supercritical water (described by a critical pressure and critical temperature of at least 218 atm and at least 374° C. respectively. The oxidation and/or pyrolysis products approach equilibrium concentrations in a reactor maintained at supercritical conditions for the mixture of supercritical water (solvent) and added reactants (solute). Besides carbon containing reactant precursors, additional reactants such as oxygen or hydrogen serve to enhance the oxidation/pyrolysis process. The reaction products undergo retrograde condensation resulting from imposed temperature gradients. The condensate is solid carbon, in the chemical form of carbon that is sp³ bond coordinated and of cubic or wurzite symmetry. The condensation process is enhanced by the presence of a seed diamond crystal.

12 Claims, 2 Drawing Sheets

APPARATUS AND METHOD FOR SYNTHESIZING DIAMOND IN SUPERCRITICAL WATER

This is a continuation of application Ser. No. 07/979,667, filed Nov. 20, 1992, now abandoned.

BRIEF DESCRIPTION OF THE INVENTION

This invention relates generally to an apparatus and method of synthesizing diamond in supercritical water, and more particularly, to an apparatus and method in which gaseous, liquid or solid phase carbon precursors are oxidized and/or pyrolized in supercritical water and the products of oxidation and/or pyrolization are transported to a seed crystal where they condense in the chemical form of carbon that is $sp^3$ bond coordinated and of cubic or wurzite symmetry.

BACKGROUND OF THE INVENTION

It is well known in the art of diamond synthesis that atomic hydrogen is an important reactive species in diamond growth at low pressures (1–760 torr) by chemical vapor deposition (K. E. Spear, J. Am. Ceram. Soc. 72, 171, 1989). It is believed that atomic hydrogen, created by dissociating molecular hydrogen, establishes active sites on an otherwise hydrogenated (and hence stabilized) diamond surface, through a dynamic balance of abstraction of surface hydrogen atoms and chemisorption. These active sites are then free to react with elemental carbon or hydrocarbon precursors. The surface complex subsequently reacts with atomic hydrogen to ultimately incorporate the transported carbon into the growing diamond lattice. Thus, diamond growth rates are favored by the production or availability of atomic hydrogen and the rate of transport of atomic hydrogen to a growing diamond surface.

It is also known that OH radicals (which, along with H, are the products of water decomposition in plasma environments, the intermediate products of the combustion of most fuels, and a major species in the high temperature reaction of molecular oxygen and dissociated hydrogen) are also important reactive species in diamond growth at low pressures by chemical vapor deposition (M. A. Cappelli and P. H. Paul, "An Investigation of Diamond Synthesis in a Premixed Oxy-Acetylene Flame", J. Appl. Phys. 67, 2596, 1990). OH radicals can play a similar role to that of atomic hydrogen in "stabilizing" the surface of diamond (preventing surface reconstruction) and is believed to be more efficient at "etching" graphite (D. E. Rosner, "High Temperature Gas-Solid Reactions," Ann. Rev. Mater. Sci. 573, 1972).

Higher growth rates are favored at higher pressures. Diamonds have been synthesized by chemically transporting carbon atoms in liquid metal solutions at high pressure (greater than 5000 atmospheres) and high temperatures (typically 1500° K.) through a temperature gradient to condense onto diamond seed crystals. The carbon atoms are supplied from forms of carbon such as graphite which are soluble in the liquid metal. (R. C. Devries, "Diamond Synthesis Under Metastable Conditions," Ann. Rev. Mater. Sci., 161; 1987).

Supercritical water is defined as water maintained above its critical pressure (218 atm) and temperature (374° C.). Supercritical water is known to be an effective solvent for large hydrocarbons and alcohols O. F. Connolly, "Solubility of Hydrocarbons in Water Near the Critical Solution Temperatures," J. Chem. Engineering Data 11, 13, 1966). Such an environment is also known to be a suitable reactive environment for the oxidation of organics (T. B. Thomason and M. Modell, "Supercritical Water Destruction of Aqueous Wastes," Hazardous Waste 1, 453, 1984; M. Modell, "Processing Methods for the Oxidation of Organics in Supercritical Water", U.S. Pat. No. 4,543,190, 1985) and the breakdown of carbonaceous materials such as a variety of coals. (I. R. Kershaw and L. J. Bagnell, "Extraction of Australian Coals with Supercritical Aqueous Solvents," in *Supercritical Fluids* (T G. Squires and M. E. Paulaitis, Eds., Amer. Chem. Soc., Washington, DC), 1987, p. 266; D. S. Ross, G. P. Hum, T-C. Miin, T. K. Green, and R. Mansuni, "Isotope Effects in Supercritical Water: Kinetic Studies of Coal Liquefaction," in *Supercritical Fluids*, (TG. Squires and M. E. Paulaitis, Eds., Amer. Chem. Soc., Washington, DC, 1987, p. 242).

OBJECTS AND SUMMARY OF THE INVENTION

It is an object of this invention to provide an apparatus and process for the synthesis of diamond from carbon precursors in a supercritical water reactor.

It is another object of this invention to provide a chemical reactor and process which employs supercritical water as an active medium for the production and transport of carbon containing molecules to a growing diamond surface.

It is another object to provide a chemical reactor which uses supercritical water as an active medium. A carbonaceous source is injected or placed upstream of the reactor and is used as a source of elemental carbon. The supercritical water acts to promote and participate in the oxidation or pyrolysis of the carbonaceous source to produce reactive intermediates which are necessary for the conversion of the carbonaceous sources to diamond.

It is still another object of the invention to provide a method of converting, in the presence of supercritical water, elemental carbon contained in a carbonaceous source such as a carbonaceous solid (i.e., graphite, charcoal or coal), an organic liquid (i.e., an alcohol such as ethanol or methanol) or a hydrocarbon vapor (i.e., methane or acetylene) to diamond (cubic or wurzite structure).

The foregoing and other objects of the invention are achieved by a method of growing a carbon crystallite structure that is $sp^3$ coordinated such as diamond (cubic structure) or lonsdaelite (wurzite structure), comprising the steps of providing a flow of a supercritical water; adding to the supercritical water suitable reactants that are either in the gaseous, liquid or solid phase under standard conditions, and which contain the elements carbon, hydrogen and oxygen; reacting the reactants to form intermediate products; providing a seed diamond crystal; establishing a temperature gradient at said seed diamond crystal; and allowing the intermediate products to react with the seed and grow diamond.

An apparatus for growing a carbon crystalline structure that is $sp^3$ coordinated such as diamond (cubic) or lonsdaelite (wurzite) comprising a pressure chamber, means for causing supercritical water to flow through said chamber, means for injecting reactants which contain carbon, hydrogen and oxygen into said supercritical water whereby they react and form reaction products, means for placing a seed crystal in said chamber, means for providing a temperature gradient toward said crystal whereby the reaction products undergo retrograde condensation at said crystal to grow said crystal.

BRIEF DESCRIPTION OF THE DRAWINGS

The foregoing and other objects of the invention will be more clearly understood from the following description, when read in conjunction with the accompanying drawings, wherein.

DESCRIPTION OF PREFERRED EMBODIMENTS

Figure 1:
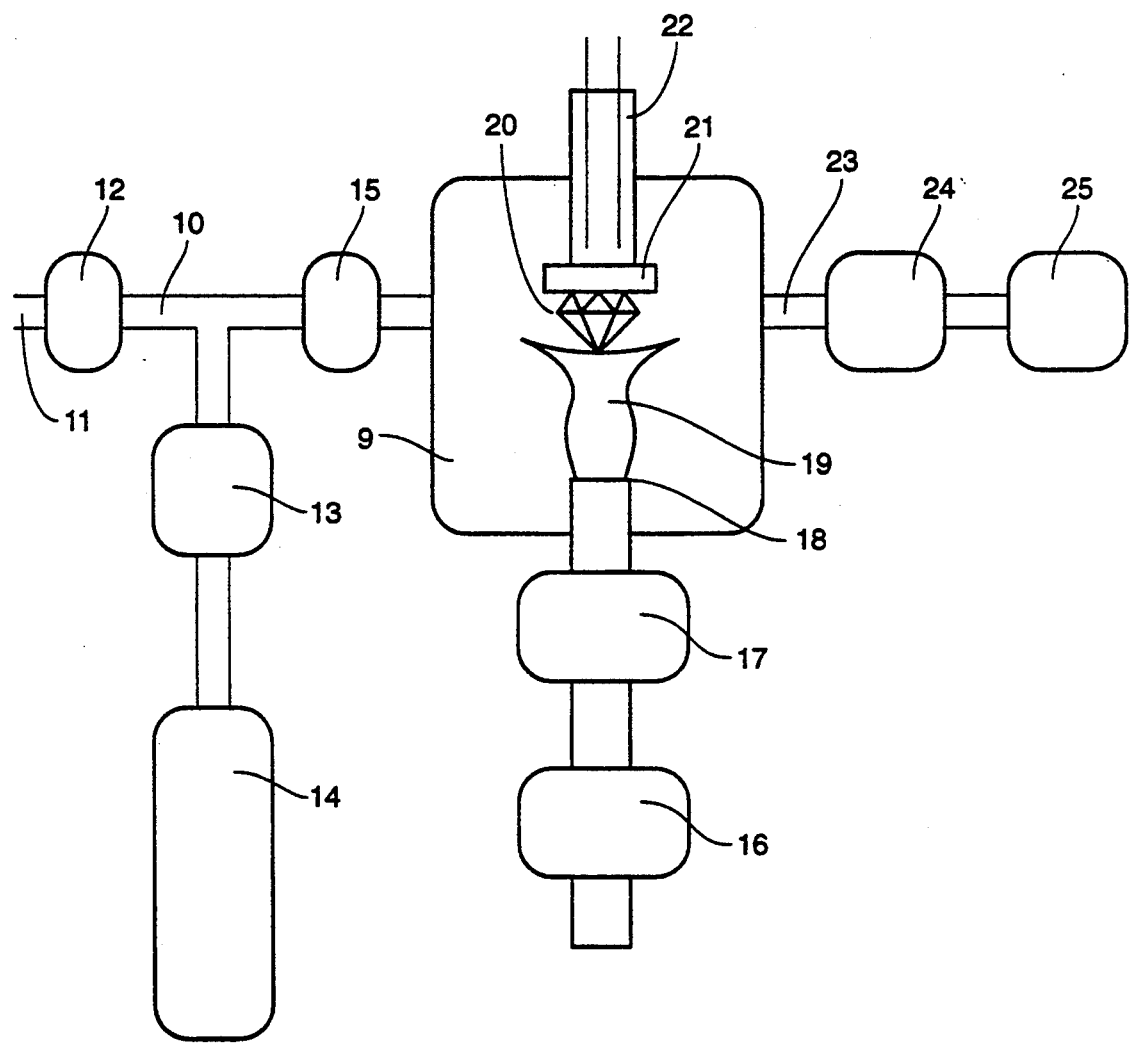
FIG. 1 schematically shows a system for methane/oxygen flame synthesis of diamond in supercritical water.

Generally, this invention consists of a chemical reactor which employs supercritical water as the active medium for the production and transport of carbon containing molecules to a diamond surface to provide growth. Suitable reactants in gaseous, liquid or solid phase, which contain the elements carbon, hydrogen and oxygen, are added to the supercritical water to form a reactant mixture. The reactants react by oxidation or pyrolysis at the supercritical conditions to produce reactive intermediates which are necessary for the conversion of the carbon to diamond.

During the oxidation/pyrolysis process at supercritical conditions associated with the solvent/reactant mixture, reactive intermediates are formed (i.e., $CH_3$, $CH_2$, $CH_3OH$, $CH_2OH$, $HO_2$, $H_2O_2$, H, OH) as a result of both heterolytic (catalyzed by OH— and H+, and bond specific) or homolytic (free-radical driven and non-specific) reactions (M. J. Antal, Jr., A. Brittain, C. DeAlmeida, S. Ramayya, and J. C. Roy, "Heterolysis and Homolysis in Supercritical Water," in Supercritical Fluids (TG. Squires and M. E. Paulaitis, Eds., American Chemical Society, Washington, DC), 1987, p. 77.

Like the injected reactants, these intermediates remain soluble in solution, approaching equilibrium concentrations at long residence times. The supercritical water environment is believed to form a "cage" structure which acts to stabilize the radical and hinder radical-radical recombination (R. K. Helling and J. W. Tester, "Oxidation Kinetics of Carbon Monoxide in Supercritical Water," J. Energy and Fuels 1,417, 1987). A temperature gradient is imposed on the flow reactor so as to promote the condensation of the carbonaceous intermediates. Such a process is referred to as retrograde condensation (W-Y. Chen and F. Kazimi, "Coal Liquefaction with Supercritical Ammonia and Amines," in Supercritical Fluid Technology (J. M. L. Penninger, M. Radosz, M. A. McHugh and V. J. Krukonis, Eds., Elsevier B. V., Amsterdam) 1985, p. 279).

The reactive intermediates, now in solution at superequilibrium concentrations relative to that computed on the basis of the local temperature of a metastable and condensed phase of carbon such as diamond, placed downstream in this flow reactor, react with the diamond so as to deposit the carbon onto the growing diamond surface. The addition of carbon to the surface leads to diamond growth provided that the diamond surface is stabilized ($Sp^3$ bond coordinated). In low pressure vapor synthesis of diamond, atomic hydrogen is present in copious amounts, and terminates the surface of diamond so as to prevent bond reconstruction. In supercritical fluids such as water, there is a sufficient level of H and OH in solution to stabilize the diamond surface in a manner similar to that in gaseous phase synthesis of diamond. More importantly, the reaction of alcohols in supercritical water, or the oxidation of hydrocarbons in supercritical water, is likely to produce other reactive species such as $HO_2$, which may play an analogous role to that of H and OH in gaseous phase diamond synthesis.

When employing water as the supercritical carrier fluid, the static pressure in the reaction chamber is nominally 218 atmospheres and higher, and is significantly higher than the pressures normally used in the vapor synthesis of diamond most often from methane and hydrogen mixtures (0.01 to 1 atm). It is important to note that there may be substantial solvent-solute interactions (J. R. Combes, K. P. Johnston, K. E. O'Shea and M. A. Fox, "Influence of Solvent-Solute and Solute-Solute Clustering on Chemical Reactions in Supercritical Fluids," in Supercritical Fluid Technology, (ACS Symposium Series 488, F. E. Bright) and that higher temperatures and pressures may be necessary to ensure that the solution mixture remains supercritical. Temperatures well above the supercritical temperature and pressures well above the supercritical pressures may be necessary to enhance the chemical reactivity of the mixture.

Chemical reactions proceed at rates generally proportional to the products of the molar concentrations of the reactants, so one would expect that the growth rate of diamond could be significantly higher than that observed in low pressure vapor synthesis, as the number densities of the flow constituents are typically 104–106 times greater in supercritical water.

Admixtures of water, $CO_2$, and CO may be beneficial in that although many hydrocarbons are reactive and soluble in supercritical water, they may require steep temperature gradients to drive the carbon condensation process. The addition of $CO_2$ or CO, (having lower critical temperatures and pressures) will likely facilitate retrograde condensation. Furthermore, entrainers such as oxygen can be used to promote oxidation and enhance the formation of $CH_3$ in solution (which is believed to be the dominant growth precursor in the synthesis of diamond), and therefore enhance the growth rates.

The invention described above and by way of example below, is a method of growing a carbon crystallite structure that is $sp^3$ coordinated such as diamond (cubic) or lonsdaelite (wurzite), comprising the steps of (1) providing a flow of a supercritical water; (2) adding suitable reactants that are either in the gaseous, liquid or solid phase under standard conditions, and which contain the elements carbon, hydrogen and oxygen; (3) creating a mixture by reacting carbon, hydrogen and oxygen in the form of intermediate products including $CH_3$, $CH_3OH$, $CH_2OH$, OH, H, $HO_2$, $H_2O_2$, etc; (4) providing a seed diamond crystal; (5) providing a temperature gradient; and (6) allowing the intermediate products to react with the seed and grow diamond.

Step 3 can be facilitated in many ways, examples of which are given below. In brief, they are: a) adding a gaseous oxidizer and gaseous fuel such as oxygen and methane respectively to supercritical water, subsequently "igniting" the mixture to sustain a diffusion flame in a high pressure cell; b) adding a liquid alcohol such as methanol to supercritical water in a high pressure flow reactor; and c) liquefying dissolving solid carbon in supercritical water, or supercritical $CO_2$, subsequently oxidizing the extract downstream of the solid carbon by the addition of oxygen to the supercritical mixture in a two-stage high pressure flow reactor. In the following section, examples are given of processes which take advantage of method (a) and (b), where the second stage is essentially that of (a) and (b). Method (c) is a variation of (a) and (b), where the second stage is essentially that of (a) and (b), and the first stage is simply the gasification of solid carbon (coal, for example) in supercritical water or carbon dioxide using well-established procedures described in the literature.

Referring to FIG. 1, there is illustrated one embodiment of apparatus suitable for carrying out the present invention. The apparatus is employed to carry out methane/ oxygen flame synthesis of diamond in supercritical water.

A supercritical aqueous mixture of water (70–95% by volume) and methane (5–30% by volume) is supplied to a thermally insulated high pressure Hastelloy, Inconel or similar alloy metal combustion cell 9 via a tube 10 made of Hastelloy Incoriel or similar alloy material. The supercritical mixture of water and methane is generated by pumping and compressing the water from supply 11 to pressures above the critical pressure (1500 atm, say) by way of a high pressure pump 12. Methane is added to the pressurized water flow by way of a high pressure metering valve 13 from pressurized cylinder 14. The mixture of water and methane flows through a preheater 15 to raise the mixture to the desired temperature, for example, 600° C. The range of total mass flow rate is 0.05–1 g/s. For a density of 0.5 g/cc and temperature of 600° C., (which is achieved at pressures of approximately 1500 atm), this would correspond to residence times of 1–50s, in a reaction cell of 1 cc volume. The residence time, $\tau_R$, is controlled by the mass flow rate, m, the cell volume $V_R$, and the density $\rho$ of the fluid, and is given by the product of density, cell volume and inverse mass flow rate. The continuous flow is necessary to remove the oxidation products to be described (primarily water, carbon dioxide, carbon monoxide, hydrocarbons and hydrogen) and replenish the cell with additional water and fuel.

Figure 2:
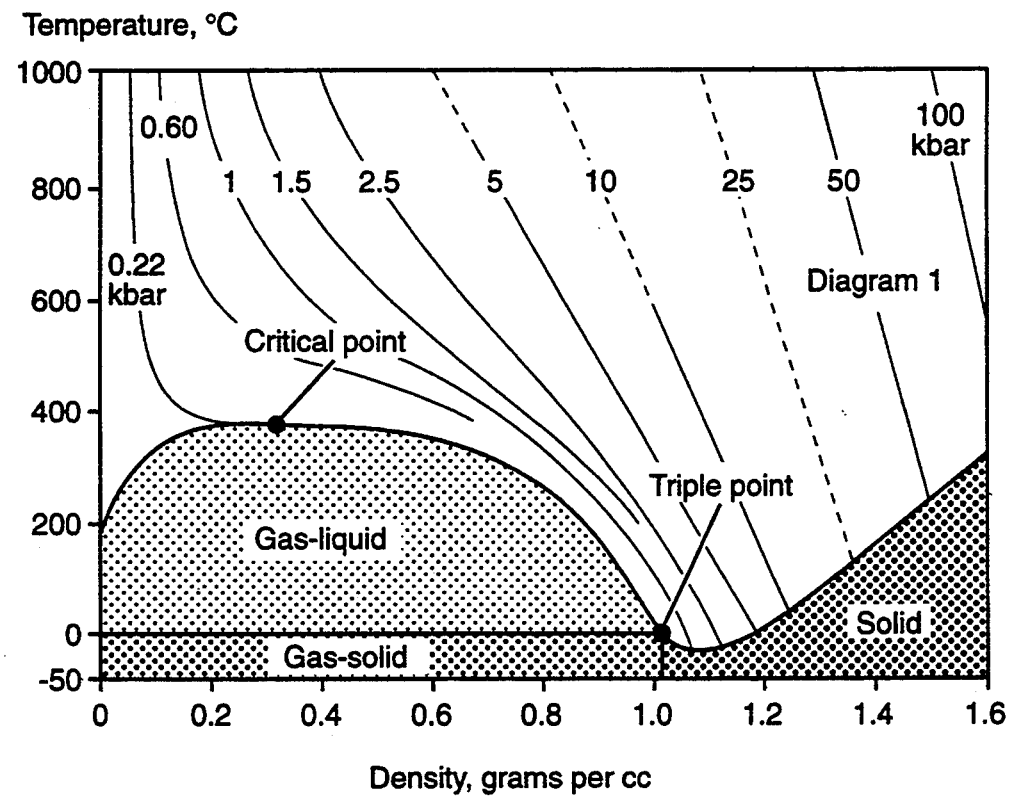
FIG. 2 is a phase diagram showing the relationship between temperature, pressure and density of water.

When the fluid is comprised primarily of water (weakly diluted with fuel), the density can be obtained from the known relation between temperature, pressure, and density, for water, as shown in FIG. 2.

As described above, the reactor cell is comprised of Hastelloy Inconel or a similar metal that can accommodate the mixture at operating conditions. The cell is surrounded by an appropriate insulation material (not shown) to provide an adiabatic environment. Oxygen is compressed to high pressures (above the pressure of the reaction cell) by way of a compressor 16 and is pumped to the reactor cell by way of a high pressure pump 17. The oxygen mass flow rate is 0.1–1 times the volumetric flow rate of the methane which can be several cubic centimeters per second at the pressure and temperature of the reactor. In essence, there is incomplete combustion of the methane, and the effluent leaving the cell will include water, hydrogen, CO, $CO_2$ and hydrocarbons. The oxygen at the point of introduction into the reactor cell at 18 ignites with the water/methane mixture and produces a self-sustaining flame 19. A diamond seed 20 is placed within the combustion zone defined by the region of heat release, where reactive intermediates such as $CH_3$, H, OH, $HO_2$, $H_2O_2$ are produced in copious amounts. This region of the flame can be significantly hotter than the supercritical water surrounding (1500°–3000° C.), and can be very luminous. These intermediates are then allowed to react with a diamond seed crystal that is placed within the combustion reaction zone to promote the growth of carbon in the form of diamond. To promote the condensation of carbon from the flame zone, the diamond seed is mounted on a water cooled substrate 21. Water flowing through the heat exchange 22 allows independent control of the diamond seed temperature and maintains the seed temperature at a level that is much lower than that of the flame, e.g., 1000°–1500° C.

The effluent leaves the reactor through a tube 23 made of Hastelloy Inconel or similar material. The supercritical effluent mixture passes through a heat exchanger 24 and back pressure regulator 25 which controls the cell pressure, and finally a gas-liquid separator (not shown) where the supercritical water is separated from the unspent fuel and any other reaction products generated by the combustion reaction.

The diamond growth mechanism is believed to be attributed to copious amounts of methyl radicals ($CH_3$), H, OH, and $HO_2$ produced in the flame zone. The diamond surface is stabilized primarily by the abstraction and bonding of atomic hydrogen. This prevents the surface reconstruction to form double ($sp^2$-non-tetrahedral) bonds and is believed to be the primary advantage of using supercritical water. The abstraction/bonding reactions are schematically represented below, where A represents a stabilized diamond surface, B represents a radical site S* formed by the reaction of OH with H, and C shows the bonding of a gas phase radical H (H or $H_2O$ or $H_2O_2$) to the radical site to restabilize the surface as shown at D.

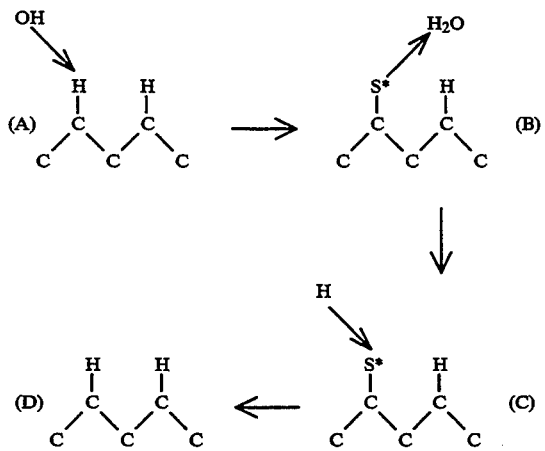

The abstraction/bonding reactions are in a dynamical balance to generate reactive sites (designated by S*) that permit the bonding of the methyl radical. This is represented schematically below. A methyl radical affixed to the reactive site A as shown at B the H's combine at C to form two reactive sites which combine to provide an additional carbon at the stabilized surface D.

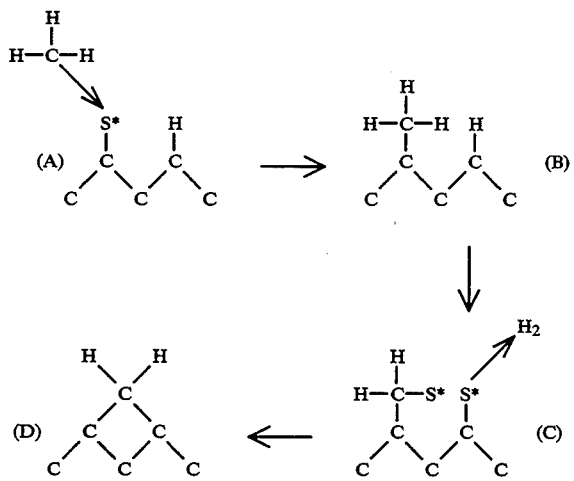

The insertion and subsequent incorporation of carbon into the growing diamond lattice follows as a result of additional abstraction reactions that remove hydrogen from the chemisorbed methyl group. In many ways, the heterogeneous mechanism proposed here is similar to that proposed to explain diamond growth in CVD environments with the exception that in addition to H and $H_2$, the reactive species that establish the surface radical sites are likely to be OH, $H_2O$, hydrogen peroxy ($HO_2$) and hydrogen peroxide $H_2O_2$).

A flame sustained in supercritical water generates molar concentrations of carbon precursor intermediates that are at least comparable to that generated in low pressure flames used in diamond growth, and intermediates such as hydrogen peroxy and hydrogen peroxide that are 100–1000 times greater than that found in low pressure flames. If these intermediate species are as effective as atomic hydrogen in the abstraction of hydrogen from diamond surfaces, then we can expect growth rates that are much greater at comparable temperatures, or, comparable growth rates at temperatures that are much lower than that employed in atmospheric pressure flame synthesis of diamond. The transport of these radicals to the growth surface are facilitated despite the higher densities, as a result of the unique capability of supercritical water to inhibit radical-radical recombination and enhance radical diffusion.

A major advantage of a flame sustained in supercritical water is that the local release of the heat of combustion generates local temperatures that are extremely high (1500°–3000°). These temperatures are much higher than that which can be tolerated in any isothermal reactor, due to the lack of suitable reactor materials that can withstand the corrosive environments of water at such pressures and temperatures.

A further advantage of the use of supercritical water is that high radical species concentrations can be stabilized by the so-called "cage" effect provided for by the polar nature of water, even at such high pressures.

Another advantage for the use of supercritical water is that its products of decomposition (H, OH etc.) may be beneficial for diamond growth.

Another apparatus suited for transporting carbon from a carbonaceous source (for example, graphite, hydrocarbons or alcohols) is to inject the source upstream in a supercritical water flow reactor at a temperature $T_{hot}$ where it reacts to product reactive intermediates conducive to diamond growth. A seed is placed downstream at a temperature $T_{cold}$. A temperature gradient is then established to promote the retrograde condensation of carbon which is at superequilibrium concentrations in the fluid phase at temperatures $T_{cold}$, onto a diamond seed crystal.

There is now described by way of example, a chemical reactor to grow diamond, where supercritical water is made to flow in a temperature controlled flow cell, and methanol is added to react with the water to produce reactive intermediates conducive to diamond growth.

Methanol pyrolizes in supercritical water, to produce carbon dioxide and hydrogen while consuming water. When oxygen is added as an entrainer, the oxidation of methanol is more complete for a given residence time, consuming the oxygen to generate additional water. During methanol decomposition in the absence of oxygen, methyl radicals ($CH_3$) can be produced either directly via $CH_3OH + H_2O \rightarrow CH_3 + OH + H_2O$ for example, or, indirectly via $CH_3OH + H \rightarrow CH_3 + H_2O$, for example. The supercritical water is known to contain some fractional dissociation products (radicals such as H, OH, and $HO_2$, e.g.) but the molar concentrations are expected to be less than that generated in the flame zone described above, when the reactants are added in small concentrations to a flow consisting primarily of supercritical water and the reaction temperatures are maintained below 1000° C. (the softening point of typical materials used in flow reactors). As a result, the surface reactive site density will be lower, and therefore growth rates will be lower; however, there may be advantages to growing diamond crystals at lower growth rates, to preserve crystalline order, and minimize crystalline defects. The mechanism describing diamond growth in this environment is qualitatively similar to that of the combustion environment described above.

Figure 3:
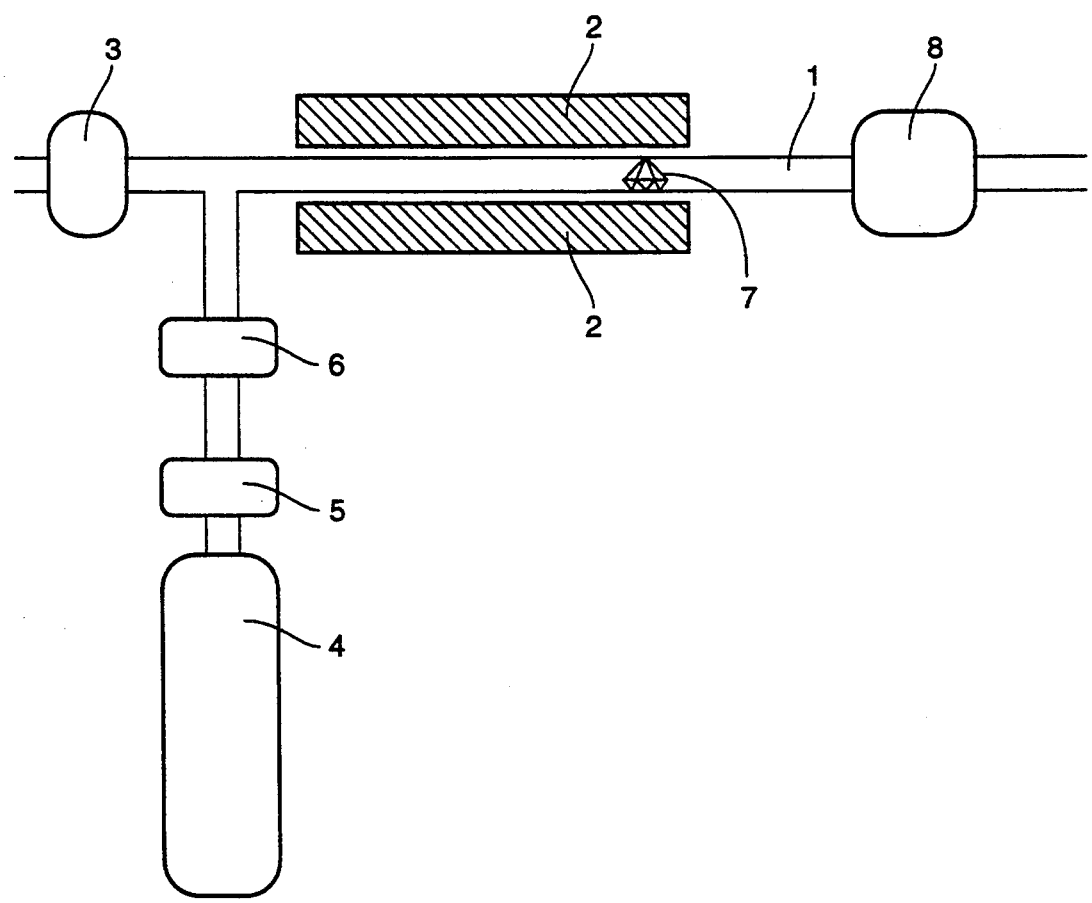
FIG. 3 schematically shows a flow reactor employed in the synthesis of diamond from methanol in supercritical water.

FIG. 3 is a schematic of the flow reactor employed in the synthesis of diamond from methanol in supercritical water. The flow reactor itself consists of a tube 1 constructed from Hastelloy, or similar materials, and is approximately 5 mm in inner diameter and many meters in length, i.e., 10 m. For a given set of operating conditions (i.e., water density, mass flow rate), the length establishes the overall residence time of the flow. The tube reactor is surrounded by a furnace 2 that raises the supercritical mixture to the desired temperature and in addition, imposes a temperature gradient onto the flow to generate conditions downstream that cause the carbon intermediates in solution to be superequilibrium in concentration.

Supercritical water is supplied to the tubular flow reactor at rates of approximately 0.1–1 gm/cc giving rise to a total residence time of 2.5–25 s, at a water density of 0.1 gm/cc (600° C. and 250 atm, say). The water is supplied to the flow reactor by first compressing the water by way of a high pressure pump 3 to the desired pressure. The methanol is added from a tank 4 to the pressurized supercritical water flow at the inlet of the tube reactor by way of a high pressure pump 5 and a high pressure metering valve 6. The methanol subsequently decomposes producing reactive carbon intermediates such as $CH_3$, $CH_3O$, etc.. The rise in these intermediates is concomitant with the production of CO and $CO_2$. A position within the reactor exists where the reactive carbon intermediates and other intermediates resulting from water decomposition are optimum for growing diamond crystals. A seed crystal 7 is placed at this optimum position (1-10 m from the inlet, say) at a position where the temperature is such that there is a superequilibrium level of carbon intermediates in solution, thereby promoting the retrograde condensation of carbon out of solution onto the diamond seed crystal. The mixture leaves the reactor via a back pressure regulator 8.

It is important to recognize that the quality of the diamond synthesized depends on parameters such as the extent of dissociation of the supercritical water, and the relative concentration of $CH_3$ to intermediate radical dissociation products such as H, OH, $HO_2$, $H_2O_2$ in the supercritical flow. The quality of the diamond grown in addition depends on the residence time of dissolved carbon in the reactor; the temperature gradient imposed on the flow and the absolute temperature at which the diamond seed is maintained.

This invention makes use of the unique properties of water (hydrocarbon solubility, radical stabilization, high radical diffusivities) and its composition (high molar concentrations of H, OH $HO_2$) above the critical pressure and critical temperature.

The advantage of these supercritical water reactors as described is that they produce copious amounts of reactive carbon containing intermediates at partial pressures comparable to or above that which can be obtained in low pressure vapor synthesis reactors.

A further advantage of the processes described is that under such pressures and such temperatures, they can be used to synthesize single crystal diamond, and consume graphite (and other forms of non-diamond carbon), hydrocarbons, alcohols and water, both of which are readily abundant, and relatively inexpensive in comparison to materials used in high pressure liquid metal catalyst and low pressure vapor synthesis techniques to growing diamond.

A further advantage to using supercritical water is that mixtures of hydrocarbon and water are common byproducts of many industrial processes (i.e., paper production) and that at supercritical conditions, hydrocarbons and oils are completely soluble in supercritical water, thereby forming a single phase fluid.

What is claimed:

1. A method of growing a diamond comprising the steps of:
    providing a diamond seed crystal,
    providing a flow of supercritical water past said seed crystal,
    adding to the supercritical water reactants which contain the elements carbon and hydrogen oxygen in the gaseous, liquid or solid phase,
    providing a reaction zone around said seed crystal, said reaction zone having a temperature of at least 600° C., and growing diamond on said seed crystal.
2. The method of claim 1 wherein the reaction is conducted in the absence of added $O_2$ gas.
3. The method of claim 1 wherein the reaction is conducted in the presence of oxygen.
4. The method of claim 2 wherein the reactants comprise methanol.
5. The method of claim 3 wherein the reactants are methane and oxygen.
6. The method of claim 1 wherein the reactants are selected to provide intermediate products including $CH_3$, $CH_2OH$, OH, and $HO_2$.
7. A method of growing a diamond comprising the steps of:
    providing in a reactor a flow of supercritical water,
    heating said supercritical water to at least 600° C,
    adding carbon-containing reactants to said supercritical water to provide reaction products including carbon at equilibrium concentration at said first temperature,
    providing a diamond seed crystal in said supercritical water at said second temperature, and
    growing diamond on said seed crystal.
8. The method of claim 7 wherein the reaction is conducted in the absence of added $O_2$ gas.
9. The method of claim 7 wherein the reaction is conducted in the presence of oxygen.
10. The method of claim 8 wherein the reactants comprise methanol.
11. The method of claim 9 wherein the reactants are methane and oxygen.
12. The method of claim 7 wherein the reactants are selected to provide intermediate products including $CH_3$, $CH_2OH$, OH, and $HO_2$.

* * * * *